United States Patent
Nomura et al.

(10) Patent No.: US 12,160,947 B2
(45) Date of Patent: Dec. 3, 2024

(54) ELECTRONIC MODULE

(71) Applicant: Murata Manufacturing Co., Ltd., Nagaokakyo (JP)

(72) Inventors: Tadashi Nomura, Nagaokakyo (JP); Hiroshi Nishikawa, Nagaokakyo (JP)

(73) Assignee: MURATA MANUFACTURING CO., LTD., Kyoto-Fu (JP)

(*) Notice: Subject to any disclaimer, the term of this patent is extended or adjusted under 35 U.S.C. 154(b) by 175 days.

(21) Appl. No.: 17/822,469

(22) Filed: Aug. 26, 2022

(65) Prior Publication Data

US 2022/0418089 A1    Dec. 29, 2022

Related U.S. Application Data

(63) Continuation of application No. PCT/JP2021/001987, filed on Jan. 21, 2021.

(30) Foreign Application Priority Data

Mar. 6, 2020   (JP) .................. 2020-039127

(51) Int. Cl.
*H05K 1/02* (2006.01)
*H05K 3/28* (2006.01)

(52) U.S. Cl.
CPC ......... *H05K 1/0215* (2013.01); *H05K 1/0218* (2013.01); *H05K 3/284* (2013.01); *H05K 2201/10098* (2013.01); *H05K 2201/10507* (2013.01)

(58) Field of Classification Search
CPC ............... H05K 1/0215; H05K 1/0218; H05K 2201/10098; H05K 2201/10507; H05K 3/284
See application file for complete search history.

(56) References Cited

U.S. PATENT DOCUMENTS

| | | | | |
|---|---|---|---|---|
| 10,192,827 | B2* | 1/2019 | Matsui | ............ H04B 1/38 |
| 2017/0098637 | A1 | 4/2017 | Hamada | |
| 2018/0096949 | A1 | 4/2018 | Chen et al. | |
| 2018/0166387 | A1 | 6/2018 | Matsui et al. | |
| 2018/0286816 | A1 | 10/2018 | Kitazaki et al. | |

(Continued)

FOREIGN PATENT DOCUMENTS

| | | | | |
|---|---|---|---|---|
| JP | WO 2007060784 | * | 5/2007 | ....... H05K 1/0218 |
| JP | 2018-098677 A | | 6/2018 | |

(Continued)

OTHER PUBLICATIONS

WO 2020067468 English translation (Year: 2020).*

(Continued)

*Primary Examiner* — Mukundbhai G Patel
(74) *Attorney, Agent, or Firm* — Pearne & Gordon LLP

(57) ABSTRACT

A module includes: a substrate having a first surface; a first component mounted on the first surface; a first sealing resin disposed to cover the first surface and the first component; a shield film covering at least a side surface of the first sealing resin; a first ground terminal mounted on the first surface; and a protruding portion formed to extend laterally at any position of the first ground terminal in a direction parallel to the first surface. The protruding portion is electrically connected to a portion of the shield film that covers the side surface of the first sealing resin.

20 Claims, 11 Drawing Sheets

(56) References Cited

U.S. PATENT DOCUMENTS

2019/0273312 A1    9/2019  Otsubo
2020/0203288 A1*   6/2020  Otsubo ................... H05K 1/02

FOREIGN PATENT DOCUMENTS

| JP | 2018-170419 A | 11/2018 | | |
|---|---|---|---|---|
| JP | 2019-021793 A | 2/2019 | | |
| JP | WO 2020067468 | * | 4/2020 | ............ H01L 23/00 |
| WO | 2015/194435 A1 | 12/2015 | | |
| WO | 2018/101384 A1 | 6/2018 | | |

OTHER PUBLICATIONS

WO 2007060784 English translation (Year: 2007).*
International Search Report for PCT/JP2021/001987 dated Apr. 13, 2021.

* cited by examiner

ELECTRONIC MODULE

CROSS REFERENCE TO RELATED APPLICATION

This is a continuation of International Application No. PCT/JP2021/001987 filed on Jan. 21, 2021 which claims priority from Japanese Patent Application No. 2020-039127 filed on Mar. 6, 2020. The contents of these applications are incorporated herein by reference in their entireties.

BACKGROUND OF THE DISCLOSURE

Field of the Disclosure

The present disclosure relates to a module.

Description of the Related Art

US Patent Application Publication No. 2018/0096949 A1 (PTL 1) describes an example module based on prior art techniques. This module includes components mounted on an upper surface and a lower surface of a substrate, respectively, with sealing resins formed to cover the components on the upper surface and the lower surface of the substrate, respectively. An upper surface and a side surface of this module are covered with a conductor film as a shield film. A ground electrode is disposed inside the substrate, and this ground electrode is exposed at a side surface of the substrate and is thereby electrically connected to the shield film. In PTL 1, solder balls are arranged on a back side of the substrate as connecting conductors for connecting the module to a mother board.

PTL 1: US Patent Application Publication No. 2018/0096949 A1

BRIEF SUMMARY OF THE DISCLOSURE

When a shield film is formed by a physical deposition method such as sputtering, the shield film on a side surface of a module decreases in thickness toward a lower surface of the module. The shield film and a ground electrode are electrically connected to each other only at a side surface of a substrate. Although the shield film on the side surface of the module extends below the substrate, the shield film is not connected to the ground electrode below the substrate. Therefore, a portion of the shield film that extends below the substrate has weaker shielding performance.

In view of this, a possible benefit of the present disclosure is to provide a module with enhanced shielding performance below a substrate.

In order to achieve the above benefit, a module based on the present disclosure includes: a substrate having a first surface; a first component mounted on the first surface; a first sealing resin disposed to cover the first surface and the first component; a shield film covering at least a side surface of the first sealing resin; a first ground terminal mounted on the first surface; and a protruding portion formed to extend laterally at any position of the first ground terminal in a direction parallel to the first surface. The protruding portion is electrically connected to a portion of the shield film that covers the side surface of the first sealing resin.

According to the present disclosure, the protruding portion is provided to extend from the first ground terminal, and the protruding portion is electrically connected to a portion of the shield film that covers the side surface of the first sealing resin, and therefore, enhanced shielding performance below the substrate can be achieved.

DETAILED DESCRIPTION OF THE DISCLOSURE

Figure 1:
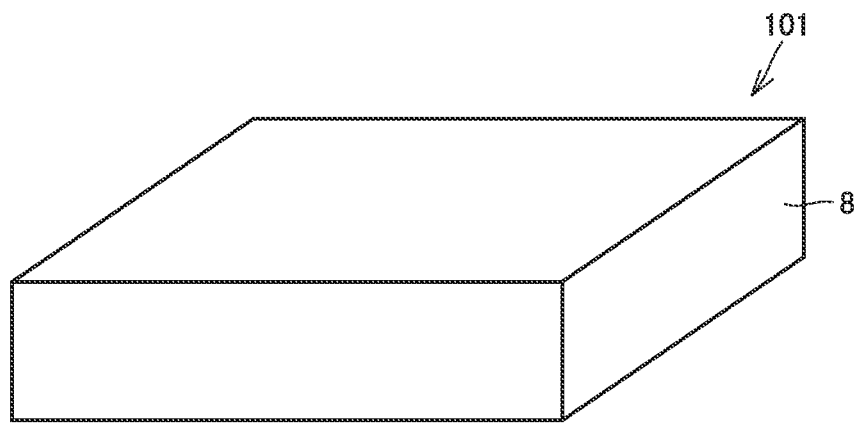
FIG. 1 is a first perspective view of a module in a first embodiment based on the present disclosure.

Any dimensional ratio shown in the drawings does not necessarily represent the exact actual dimensional ratio, but may be exaggerated for the purpose of illustration. In the following description, the concept "top/upper" or "bottom/lower" mentioned herein does not necessarily refer to the exact "top/upper" or "bottom/lower," but may refer, in a relative sense, to "top/upper" or "bottom/lower" of a posture shown in a drawing(s).

First Embodiment

Referring to FIGS. 1 to 6, a module in a first embodiment based on the present disclosure is described.

Figure 2:
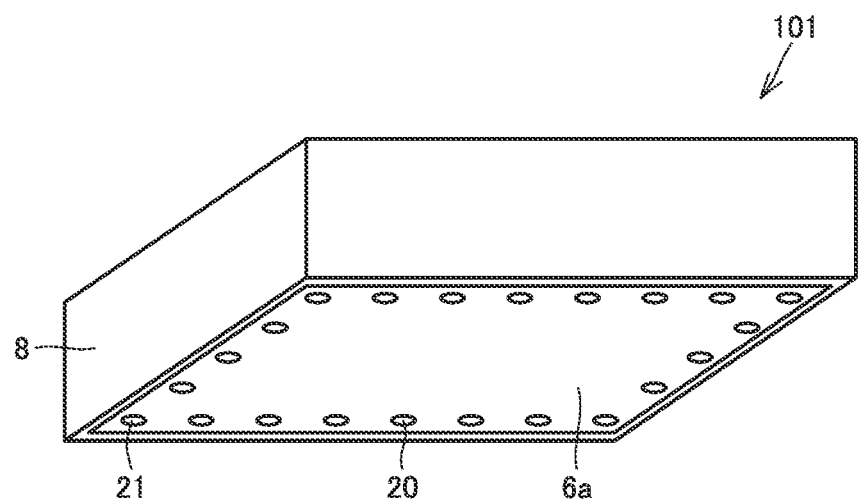
FIG. 2 is a second perspective view of the module in the first embodiment based on the present disclosure.
Figure 3:
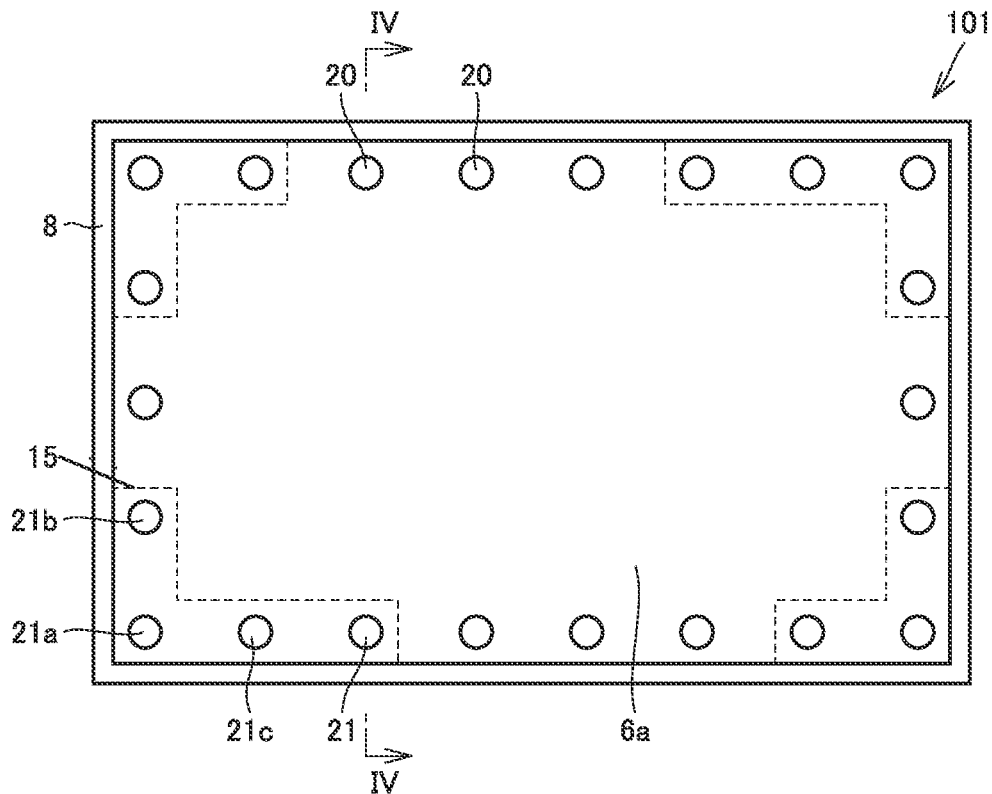
FIG. 3 is a bottom view of the module in the first embodiment based on the present disclosure.
Figure 4:
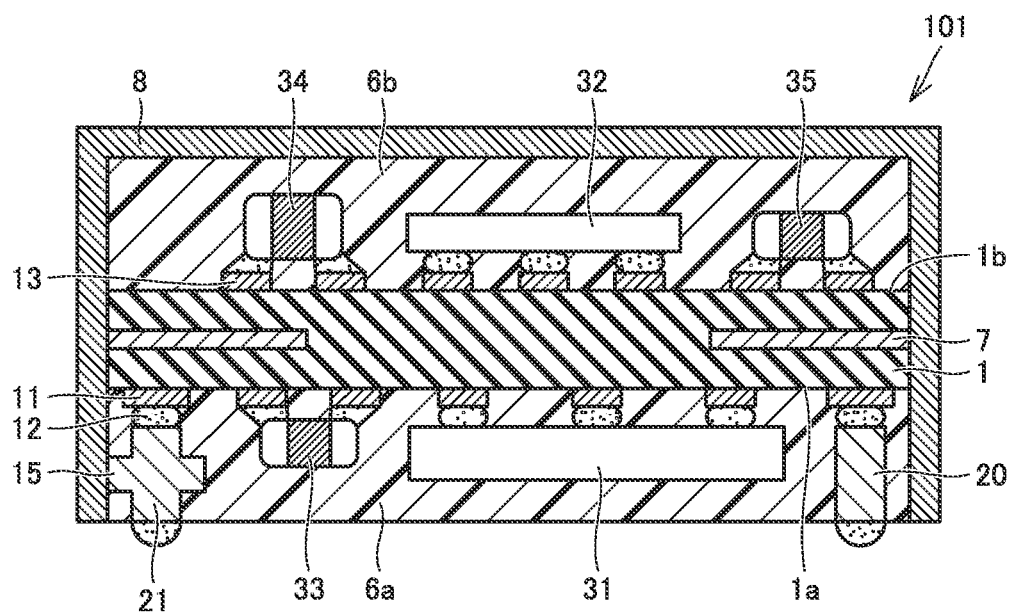
FIG. 4 is a cross-sectional view along a line IV-IV in FIG. 3 as seen in the direction of arrows.

FIG. 1 shows the appearance of a module 101 in the present embodiment. An upper surface and a side surface of module 101 are covered with a shield film 8. FIG. 2 shows module 101 in FIG. 1 when viewed from below at an angle. A lower surface of module 101 is not covered with shield film 8, causing a first sealing resin 6a to be exposed. One or more signal terminals 20 and one or more ground terminals 21 are provided on the lower surface of module 101. The numbers, sizes and arrangements of signal terminals 20 and ground terminals 21 shown in FIG. 2 are merely exemplary. FIG. 3 shows a bottom view of module 101. FIG. 4 shows a cross-sectional view along a line Iv-Iv in FIG. 3 as seen in the direction of arrows. Substrate 1 may include wires on its surfaces or inside the substrate. Substrate 1 may be a resin substrate or a ceramic substrate. Substrate 1 may be a multilayer substrate. In other words, substrate 1 may be a resin multilayer substrate or a ceramic multilayer substrate.

Module 101 in the present embodiment includes: substrate 1 having a first surface 1a; a first component 31 mounted on first surface 1a; first sealing resin 6a disposed to cover first surface 1a and first component 31; shield film 8 covering at least a side surface of first sealing resin 6a; a first ground terminal 21a mounted on first surface 1a; and a protruding portion 15 formed to extend laterally at any position of first ground terminal 21a in a direction parallel to first surface 1a. Protruding portion 15 is electrically connected to a portion of shield film 8 that covers the side surface of first sealing resin 6a. First ground terminal 21a is columnar and passes through first sealing resin 6a. Module 101 includes columnar signal terminal 20 passing through first sealing resin 6a. Signal terminal 20 is mounted on first surface 1a.

In the example shown here, first surface 1a of substrate 1 is a lower surface of substrate 1. First component 31 is mounted on first surface 1a. First component 31 may be an integrated circuit (IC), for example. More specifically, first component 31 may be a low noise amplifier (LNA), for example.

The shapes, sizes, numbers and arrangements of the respective terminals shown in FIG. 3 are merely exemplary. In this example, there are four ground terminals 21 at the lower left corner of the figure, three ground terminals 21 at the upper left corner of the figure, three ground terminals 21 at the lower right corner of the figure, and four ground terminals 21 at the upper right corner of the figure. There are three signal terminals 20 along the lower side of the figure, and three signal terminals 20 along the upper side of the figure. As shown in FIG. 3, a mass of ground terminals coupled together by protruding portion 15 is disposed at each of the four corners. Protruding portion 15 is indicated by a broken line because it is covered and hidden by first sealing resin 6a. In the example shown in FIG. 3, any one of ground terminals 21 may be regarded as a first ground terminal. Whichever of ground terminals 21 is regarded as a first ground terminal, protruding portion 15 is formed to extend laterally in the middle of the first ground terminal in the direction parallel to first surface 1a. Here, for the purpose of illustration, one ground terminal 21 at the lower left corner is regarded as first ground terminal 21a.

Module 101 includes a second ground terminal 21b and a third ground terminal 21c in addition to first ground terminal 21a.

As shown in FIG. 4, a second component 32 and components 34 and 35 are mounted on a second surface 1b of substrate 1. Second surface 1b and these components are covered with a second sealing resin 6b.

Figure 5:
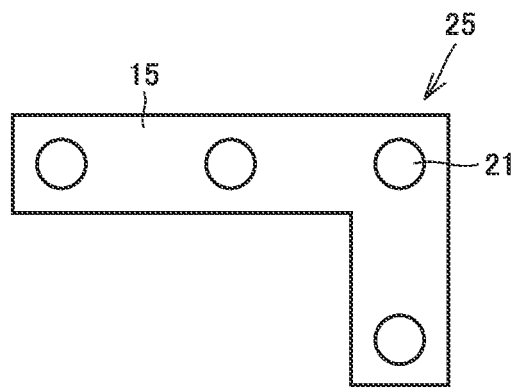
FIG. 5 is a plan view of a structure included in the module in the first embodiment based on the present disclosure.
Figure 6:
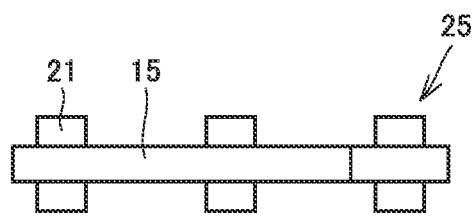
FIG. 6 is a front view of the structure included in the module in the first embodiment based on the present disclosure.

FIG. 5 shows a mass of ground terminals at the upper right corner of FIG. 3, for example. A mass 25 includes four ground terminals 21 and one protruding portion 15. Protruding portion 15 is L-shaped. Four ground terminals 21 are connected together by protruding portion 15. FIG. 6 shows mass 25 when viewed from the front. Ground terminals 21 are formed to protrude above and below protruding portion 15, respectively. The specific configuration of mass 25 shown here is merely exemplary.

Module 101 in the present embodiment includes protruding portion 15 extending from first ground terminal 21a, and protruding portion 15 is electrically connected to the portion of shield film 8 that covers the side surface of first sealing resin 6a, and therefore, enhanced shielding performance below substrate 1 can be achieved.

As has been described in the present embodiment, preferably, module 101 includes second ground terminal 21b mounted on first surface 1a, and protruding portion 15 couples first ground terminal 21a and second ground terminal 21b to each other, and is further formed to extend outward from first ground terminal 21a and second ground terminal 21b. In the example shown in FIG. 3, any one of ground terminals 21 may be regarded as a first ground terminal, and a ground terminal 21 adjacent to this first ground terminal may be regarded as a second ground terminal. Two adjacent ground terminals 21 are coupled to each other by protruding portion 15. By employing this configuration, adjacent ground terminals 21 are constrained to each other, and therefore, the warpage of the entire module can be suppressed, and the occurrence of a break in a joint portion where a mother board and a connecting conductor are joined to each other can be reduced. Second ground terminal 21b is columnar and passes through first sealing resin 6a.

As has been described in the present embodiment, preferably, the module includes third ground terminal 21c mounted on first surface 1a, protruding portion 15 couples first ground terminal 21a and third ground terminal 21c to each other, and is further formed to extend outward from first ground terminal 21a, second ground terminal 21b and third ground terminal 21c, and when viewed in the direction perpendicular to first surface 1a, second ground terminal 21b, first ground terminal 21a and third ground terminal 21c are arranged in an L-shape in this order. In the example shown in FIG. 3, these three ground terminals 21 are arranged in an L-shape in this order, and are also coupled together by protruding portion 15. By employing this configuration, these three ground terminals 21 are firmly constrained, and therefore, the warpage of the entire module can be more effectively suppressed, and the occurrence of a break in the joint portion where the mother board and the connecting conductor are joined to each other can be reduced. Third ground terminal 21c is columnar and passes through first sealing resin 6a.

As has been described in the present embodiment, preferably, first ground terminal 21a is located in a corner portion of first surface 1a. A module is formed of a combination of members having different coefficients of linear expansion, and is thus prone to warpage. The module warps to a greater extent toward the outer periphery of the module. Since a connecting conductor for connecting a module to a mother board is generally disposed near the outer periphery, a joint portion where the mother board and the connecting conductor are joined to each other tends to break when the module warps. By employing the configuration described above, however, the corner portion can have increased strength. As a result, the warpage of the entire module can be more effectively suppressed, and the occurrence of a break in the joint portion where the mother board and the connecting conductor are joined to each other can be reduced.

While protruding portion 15 extends from the middle of first ground terminal 21a in the direction parallel to first surface 1a as an example in the present embodiment, the position where protruding portion 15 extends is not limited to the middle of first ground terminal 21a. Protruding portion 15 may extend from an upper end portion or a lower end portion of first ground terminal 21a. However, as has been described in the present embodiment, protruding portion 15 is preferably located in the middle of first ground terminal 21a in the direction perpendicular to first surface 1a. By employing this configuration, electrical connection to shield film 8 can be established in the middle of first ground terminal 21a, and therefore, enhanced shielding performance can be more effectively achieved.

As has been described in the present embodiment, preferably, substrate 1 has second surface 1b as a surface opposite to first surface 1a, and module 101 includes second component 32 mounted on second surface 1b. By employing this configuration, module 101 has a double-sided mounting structure, thereby allowing more components to be mounted on substrate 1 with a limited area.

(Manufacturing Method)

Figure 7:
FIG. 7 illustrates a first step of a method for manufacturing the module in the first embodiment based on the present disclosure.

Referring to FIGS. 7 to 19, a method for manufacturing module 101 is described. First, as shown in FIG. 7, a plate member 40 is prepared. Plate member 40 may be a metal plate. The material for plate member 40 may be copper, for example.

Figure 8:
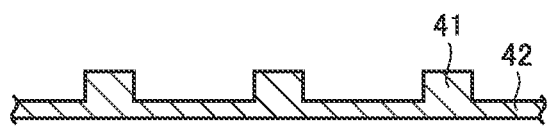
FIG. 8 illustrates a second step of the method for manufacturing the module in the first embodiment based on the present disclosure.
Figure 9:
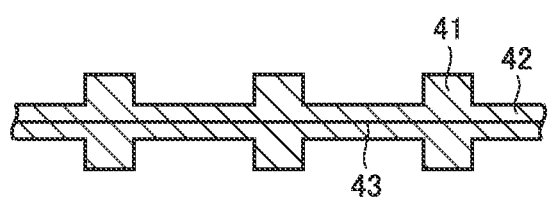
FIG. 9 illustrates a third step of the method for manufacturing the module in the first embodiment based on the present disclosure.

Plate member 40 is pressed to form a structure as shown in FIG. 8. FIG. 8 is a cross-sectional view. As shown in FIG. 8, a protrusion 41 is formed. The remaining portion is a flat portion 42. Two structures each of which is shown in FIG. 8 are prepared, and joined to each other in an overlapping manner so that their flat surfaces meet each other, as shown in FIG. 9. FIG. 9 shows a joint portion 43. At joint portion 43, the structures may be welded, or joined to each other with solder therebetween.

Figure 10:
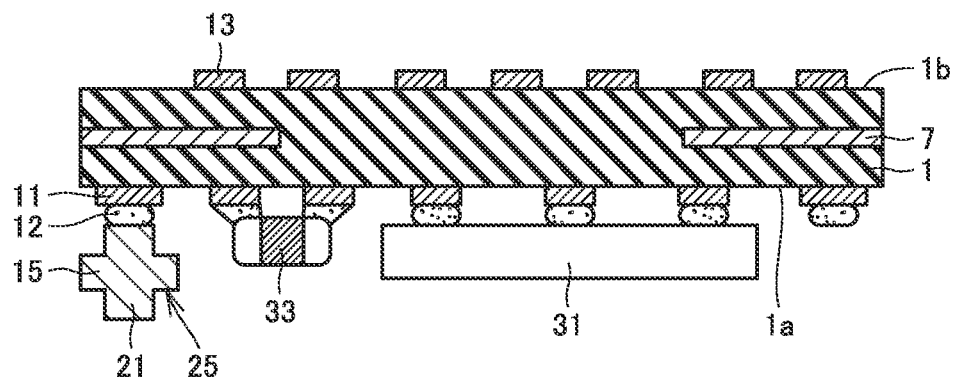
FIG. 10 illustrates a fourth step of the method for manufacturing the module in the first embodiment based on the present disclosure.

As shown in FIG. 10, mass 25 is mounted on first surface 1a of substrate 1. An electrode 11 is provided on first surface 1a of substrate 1. A solder 12 is interposed between mass 25 and electrode 11. First component 31 and a component 33 are also mounted on first surface 1a of substrate 1. An electrode 13 is provided on second surface 1b of substrate 1.

Figure 11:
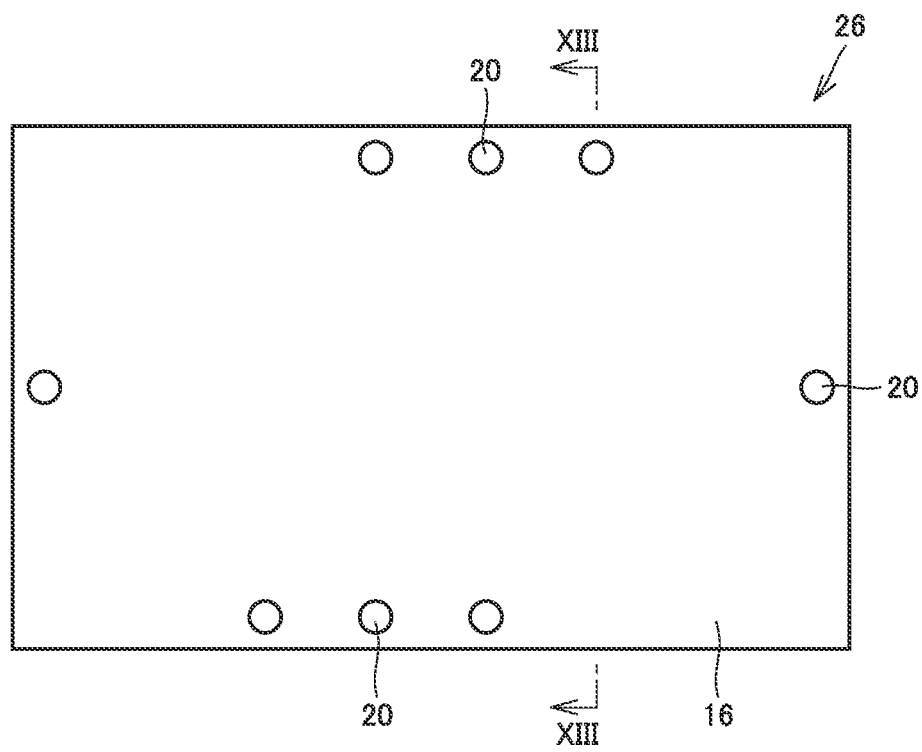
FIG. 11 is a plan view of a structure used in the method for manufacturing the module in the first embodiment based on the present disclosure.
Figure 12:
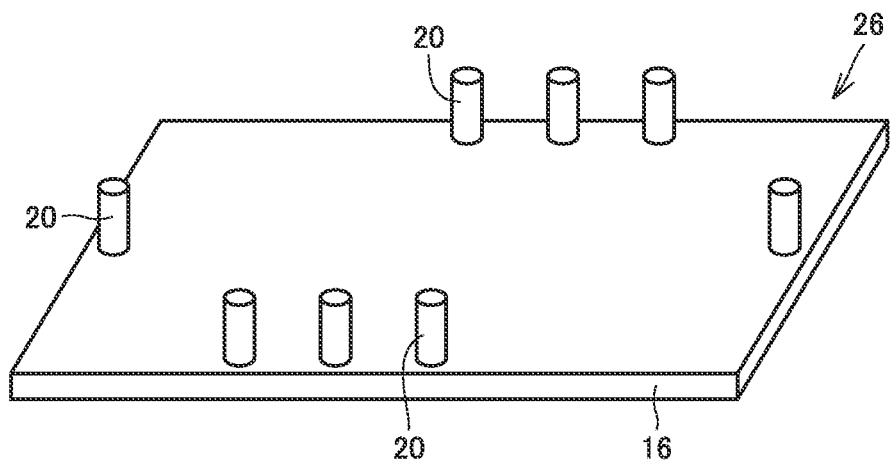
FIG. 12 is a perspective view of the structure used in the method for manufacturing the module in the first embodiment based on the present disclosure.
Figure 13:
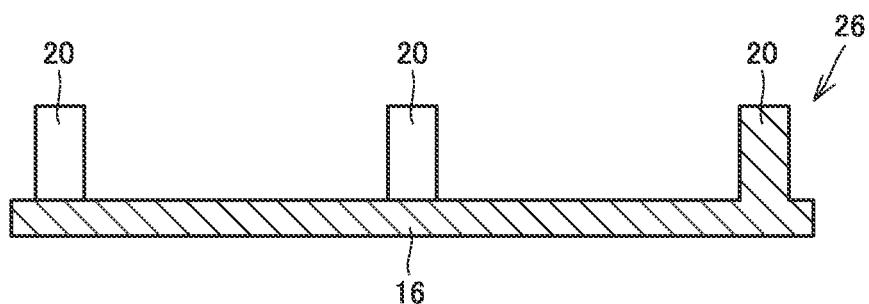
FIG. 13 is a front view of the structure used in the method for manufacturing the module in the first embodiment based on the present disclosure.
Figure 14:
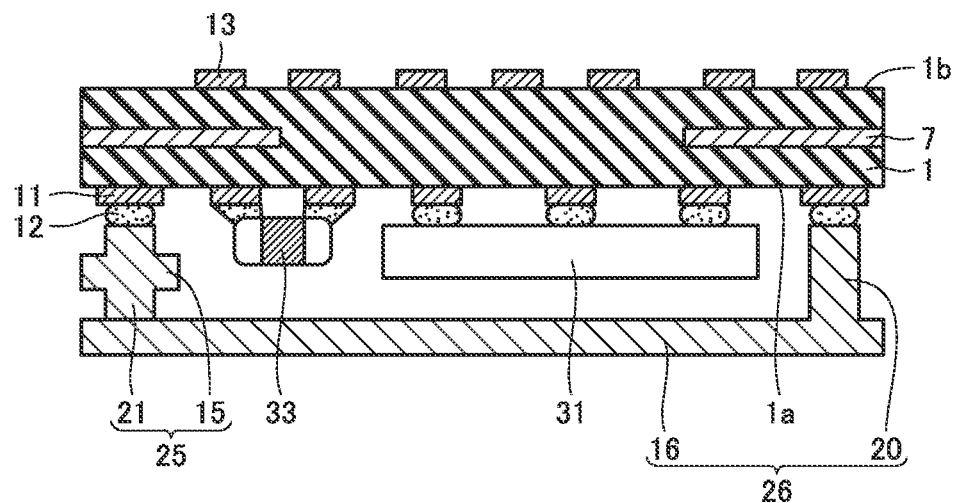
FIG. 14 illustrates a fifth step of the method for manufacturing the module in the first embodiment based on the present disclosure.

A structure 26 such as shown in FIG. 11 is prepared. FIG. 11 is a plan view of structure 26. FIG. 12 shows a perspective view of structure 26. FIG. 13 shows a front view of structure 26. Structure 26 is unitary and formed of a conductor. The material for structure 26 is copper, for example. Structure 26 includes a plate portion 16 and several signal terminals 20. Signal terminals 20 are columnar. Each signal terminal 20 is disposed perpendicular to plate portion 16. FIG. 14 shows a state corresponding to the state of FIG. 10 with structure 26 mounted thereon. Signal terminal 20 is electrically connected to electrode 11 via solder 12. While three signal terminals 20 are shown in FIG. 13, the central one of signal terminals 20 is not shown in FIG. 14 for the purpose of illustration. Leftmost signal terminal 20 visible in FIG. 13 is invisible in FIG. 14 as it hides behind leftmost ground terminal 21.

Figure 15:
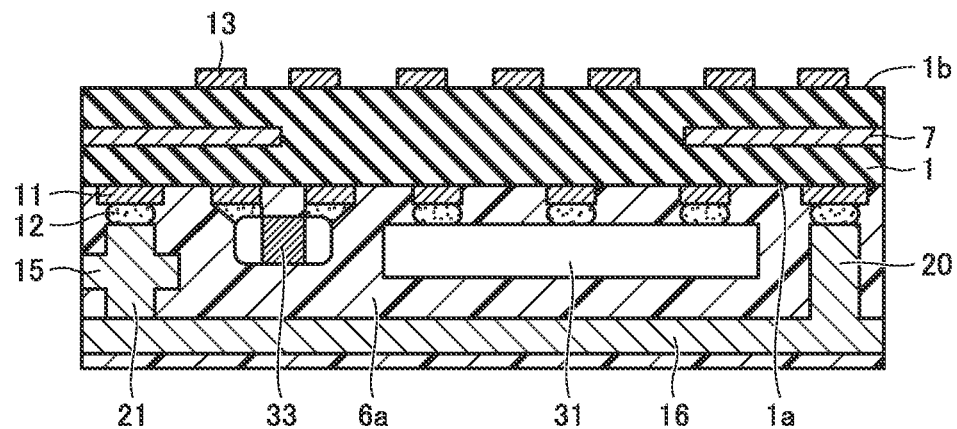
FIG. 15 illustrates a sixth step of the method for manufacturing the module in the first embodiment based on the present disclosure.

As shown in FIG. 15, first sealing resin 6a is formed. Structure 26 is covered with first sealing resin 6a. Protruding portion 15 is exposed at the side surface of first sealing resin 6a. While the range corresponding to one module is illustrated and described here, the manufacturing process may actually proceed using a mass substrate corresponding to a plurality of modules. If the manufacturing process is carried out using a mass substrate, the step of forming first sealing resin 6a may be performed while still using the mass substrate. In that case, protruding portion 15 may not yet be exposed at the side surface of first sealing resin 6a. Protruding portion 15 may be exposed at the side surface at a later step, when the mass substrate is divided into individual module sizes. FIG. 15 shows a state after the division into individual module sizes from the mass substrate.

Figure 16:
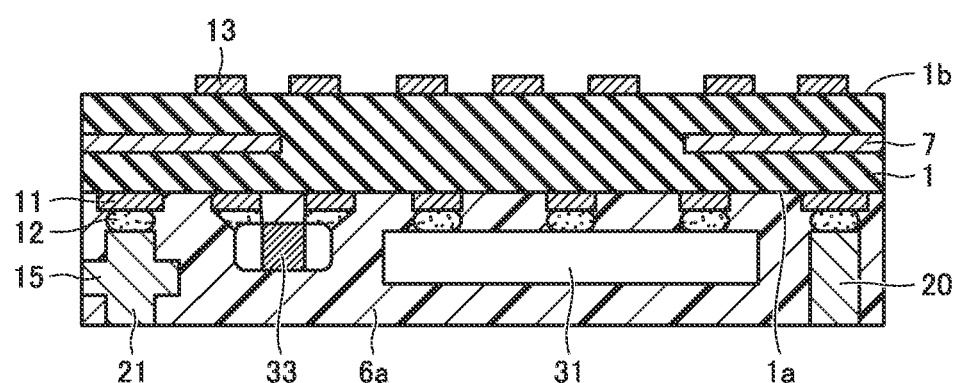
FIG. 16 illustrates a seventh step of the method for manufacturing the module in the first embodiment based on the present disclosure.

As shown in FIG. 16, the lower surface is polished. The polishing removes plate portion 16, and exposes the respective end faces of signal terminal 20 and ground terminal 21 at first sealing resin 6a. If the manufacturing process is carried out using a mass substrate, the polishing of the lower surface may be performed while still using the mass substrate.

Figure 17:
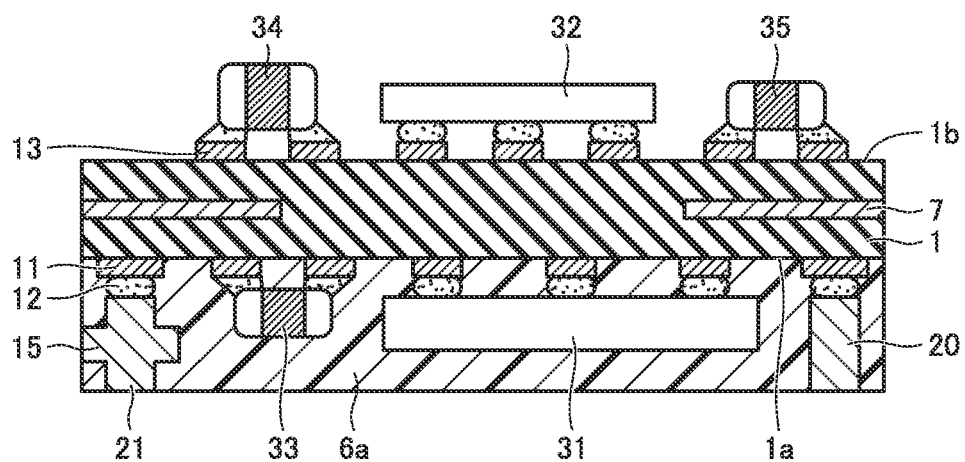
FIG. 17 illustrates an eighth step of the method for manufacturing the module in the first embodiment based on the present disclosure.

As shown in FIG. 17, second component 32 and components 34 and 35 are mounted on second surface 1b. Second component 32 and components 34 and 35 are each mounted via electrode 13.

Figure 18:
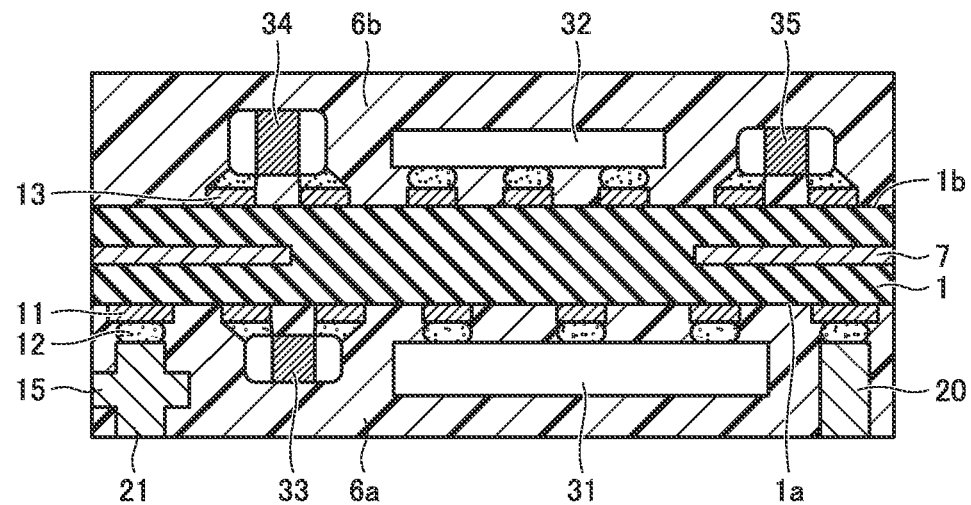
FIG. 18 illustrates a ninth step of the method for manufacturing the module in the first embodiment based on the present disclosure.

As shown in FIG. 18, second sealing resin 6b is disposed to cover second surface 1b and second component 32. Components 34 and 35 are also covered with second sealing resin 6b.

Figure 19:
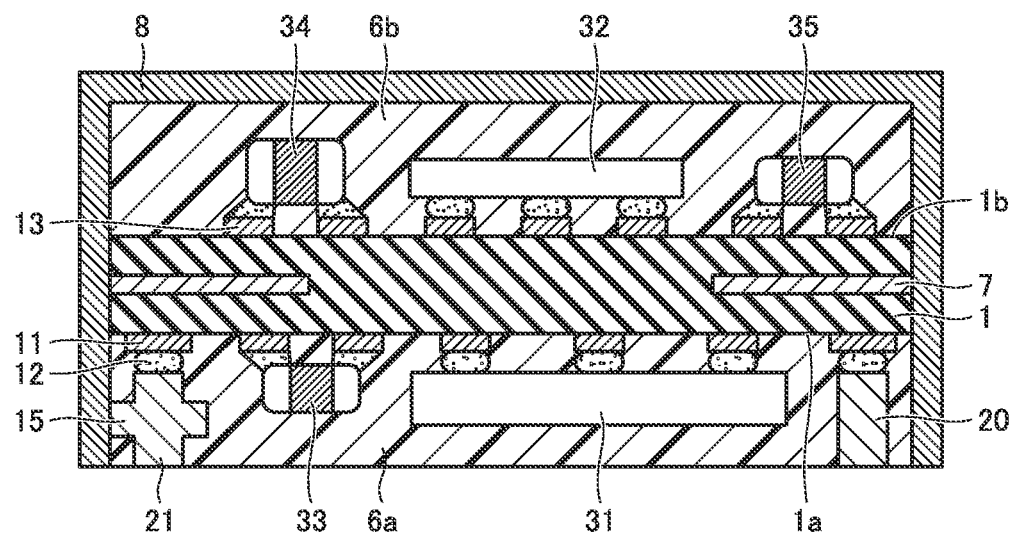
FIG. 19 illustrates a tenth step of the method for manufacturing the module in the first embodiment based on the present disclosure.

As shown in FIG. 19, shield film 8 is formed. Shield film 8 can be formed by sputtering or other methods. Shield film 8 covers an upper surface and a side surface of second sealing resin 6b, a side surface of substrate 1, and the side surface of first sealing resin 6a. At the portion of the side surface of first sealing resin 6a where protruding portion 15 is exposed, protruding portion 15 and shield film 8 are electrically connected to each other.

Furthermore, if necessary, solder is applied to the exposed end faces of signal terminal 20 and ground terminal 21. Module 101 shown in FIG. 4 is thus obtained.

Second Embodiment

Figure 20:
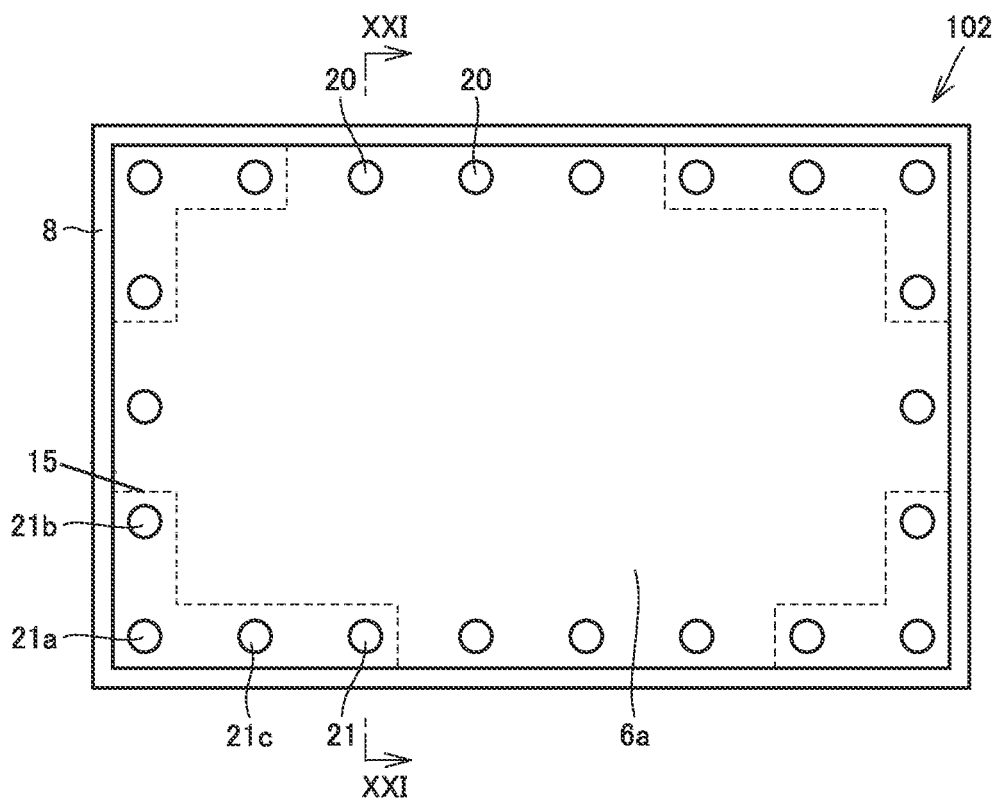
FIG. 20 is a bottom view of a module in a second embodiment based on the present disclosure.
Figure 21:
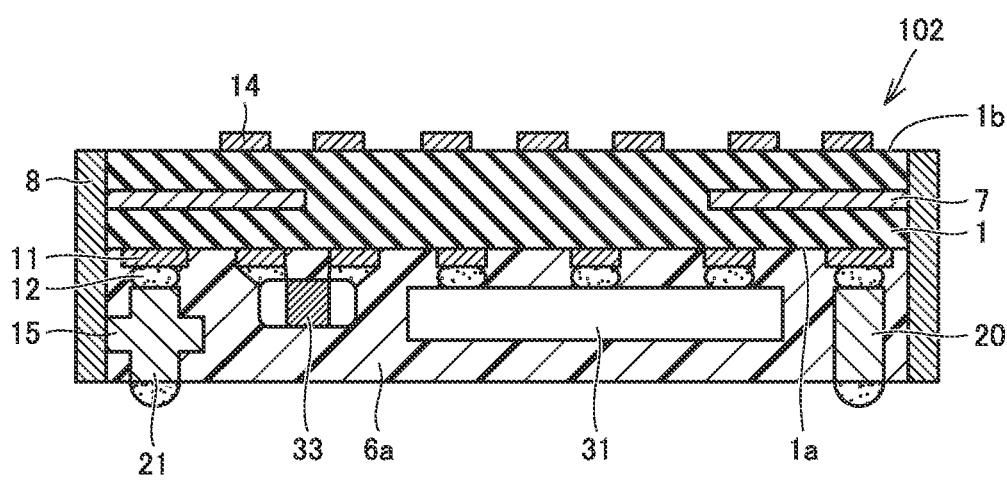
FIG. 21 is a cross-sectional view along a line XXI-XXI in FIG. 20 as seen in the direction of arrows.

Referring to FIGS. 20 to 21, a module in a second embodiment based on the present disclosure is described. FIG. 20 shows a bottom view of a module 102 in the present embodiment. FIG. 21 shows a cross-sectional view along a line XXI-XXI in FIG. 20 as seen in the direction of arrows. In module 102, substrate 1 has second surface 1b as a surface opposite to first surface 1a, and an antenna 14 is disposed on second surface 1b. A surface of first sealing resin 6a facing away from substrate 1 is not covered with shield film 8.

The advantageous effect described in the first embodiment can be obtained in the present embodiment as well. Module 102 in the present embodiment includes antenna 14, and can therefore conduct wireless communication.

Third Embodiment

Figure 22:
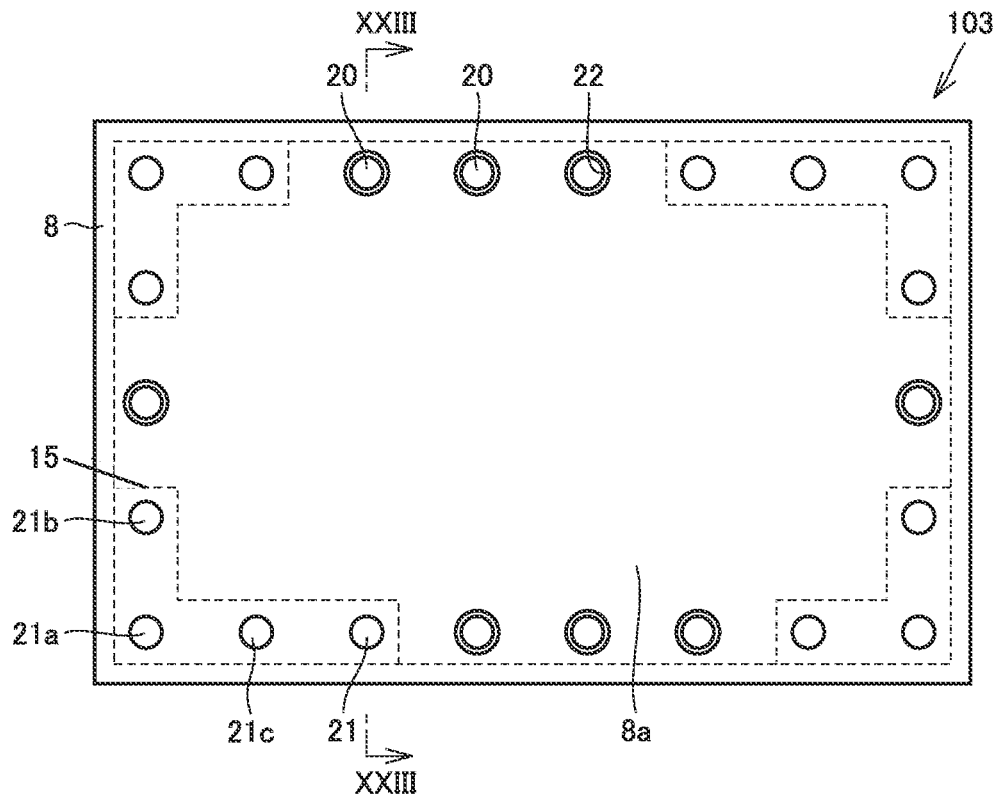
FIG. 22 is a bottom view of a module in a third embodiment based on the present disclosure.
Figure 23:
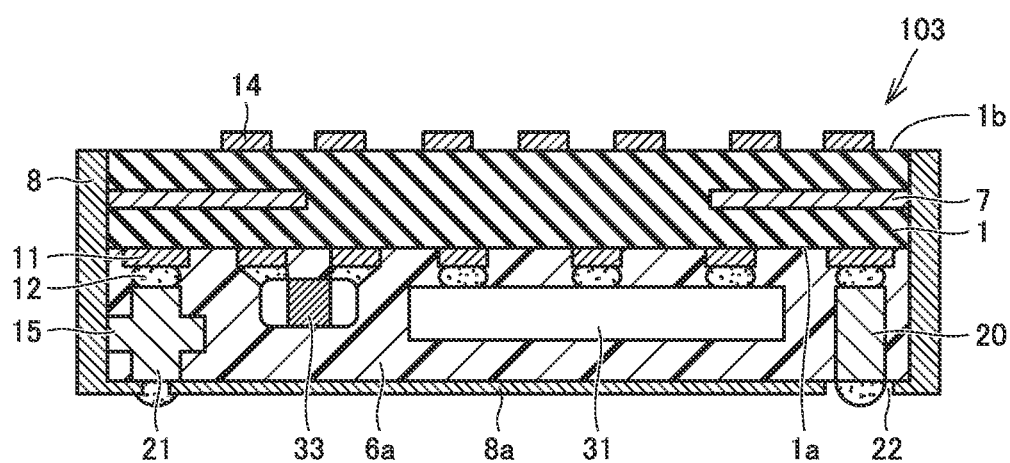
FIG. 23 is a cross-sectional view along a line XXIII-XXIII in FIG. 22 as seen in the direction of arrows.

Referring to FIGS. 22 to 23, a module in a third embodiment based on the present disclosure is described. FIG. 22 shows a bottom view of a module 103 in the present embodiment. FIG. 23 shows a cross-sectional view along a line XXIII-XXIII in FIG. 22 as seen in the direction of arrows. In module 103, shield film 8 includes a backside shield film 8a. The surface of first sealing resin 6a facing away from substrate 1 is covered with backside shield film 8a. Backside shield film 8a is part of shield film 8, and can therefore be described as below.

In module 103, shield film 8 covers the surface of first sealing resin 6a facing away from substrate 1. Shield film 8 has an opening 22 in the surface of first sealing resin 6a facing away from substrate 1. Module 103 includes signal terminal 20 mounted on first surface 1a. Signal terminal 20 is exposed at opening 22 without being electrically connected to shield film 8.

As shown in FIG. 23, ground terminal 21 has a lower end electrically connected to backside shield film 8a. Specifically, in a portion of backside shield film 8a that corresponds to ground terminal 21, an opening having a diameter smaller than the outer diameter of ground terminal 21 is provided, and solder is applied through this opening from outside of backside shield film 8a so as to come into contact with ground terminal 21. Ground terminal 21 is electrically connected to a side surface of shield film 8 via protruding portion 15, and is also electrically connected at its lower end to backside shield film 8a. In a portion of backside shield film 8a that corresponds to signal terminal 20, on the other hand, opening 22 having a diameter larger than the outer diameter of signal terminal 20 is provided, and signal terminal 20 is exposed to the outside without coming into contact with backside shield film 8a.

First ground terminal 21a is electrically connected to a portion of shield film 8 that covers the surface of first sealing resin 6a facing away from substrate 1, that is, to backside shield film 8a.

The advantageous effect described in the second embodiment can be obtained in module 103 in the present embodiment. Furthermore, module 103 includes backside shield film 8a as part of shield film 8, and can therefore achieve enhanced shielding performance on first component 31 and the like mounted on first surface 1a of substrate 1.

Fourth Embodiment

Figure 24:
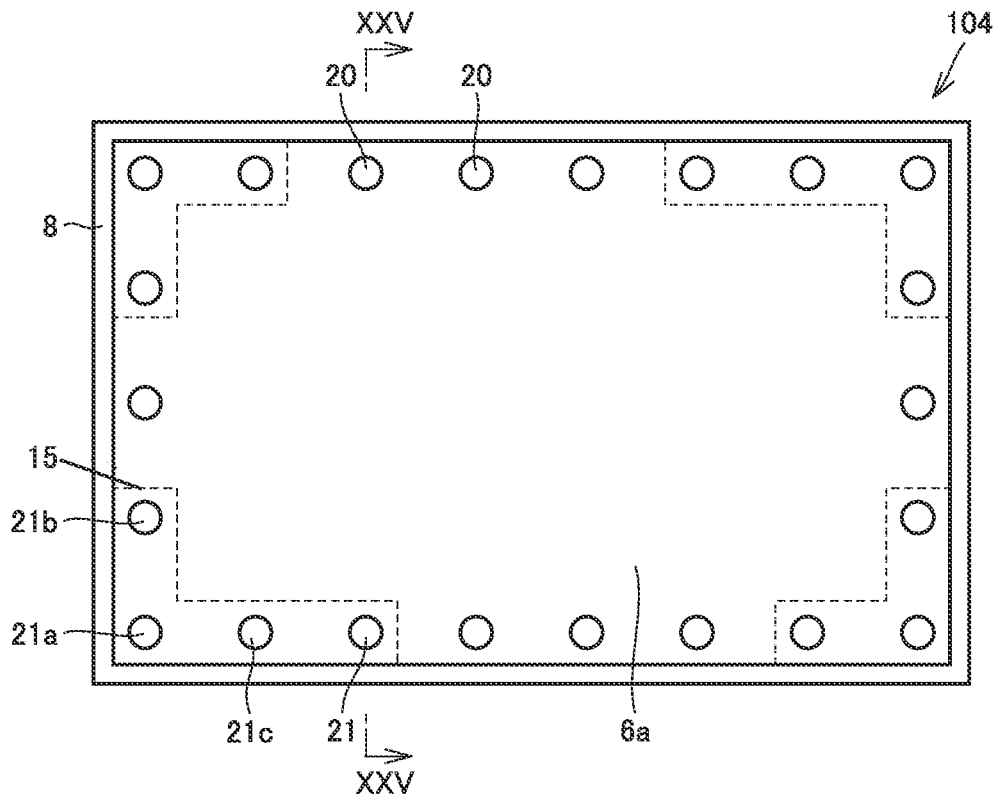
FIG. 24 is a bottom view of a module in a fourth embodiment based on the present disclosure.
Figure 25:
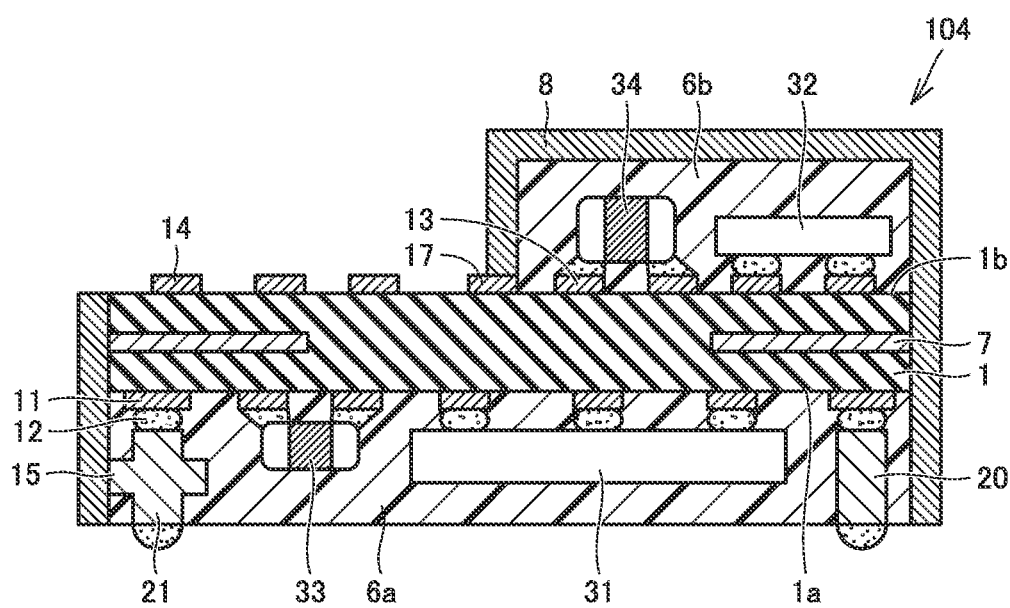
FIG. 25 is a cross-sectional view along a line XXV-XXV in FIG. 24 as seen in the direction of arrows.

Referring to FIGS. 24 to 25, a module in a fourth embodiment based on the present disclosure is described. FIG. 24 shows a bottom view of a module 104 in the present embodiment. FIG. 25 shows a cross-sectional view along a line XXV-XXV in FIG. 24 as seen in the direction of arrows. In module 104, second sealing resin 6b covers part of second surface 1b of substrate 1. Antenna 14 is disposed on a portion of second surface 1b that is not covered with second sealing resin 6b. In module 104, electrode 13 and a ground electrode 17 are also provided on second surface 1b in addition to antenna 14. Second component 32 and component 34 are each mounted via electrode 13. Ground electrode 17 is grounded by wires not shown in the figure. Ground electrode 17 is disposed on the boundary between a region covered with second sealing resin 6b and a region not covered with second sealing resin 6b. Ground electrode 17 is electrically connected to shield film 8. The surface of first sealing resin 6a facing away from substrate 1 is not covered with shield film 8.

Module 104 in the present embodiment can conduct wireless communication using antenna 14, and has a double-sided mounting structure, thereby allowing more components to be mounted on substrate 1 with a limited area.

In forming shield film 8 by sputtering in order to manufacture module 104 in the present embodiment, second surface 1b of substrate 1 may be partially covered with a mask as appropriate. As a result, a structure in which second surface 1b is not partially covered with shield film 8 can be obtained.

Fifth Embodiment

Figure 26:
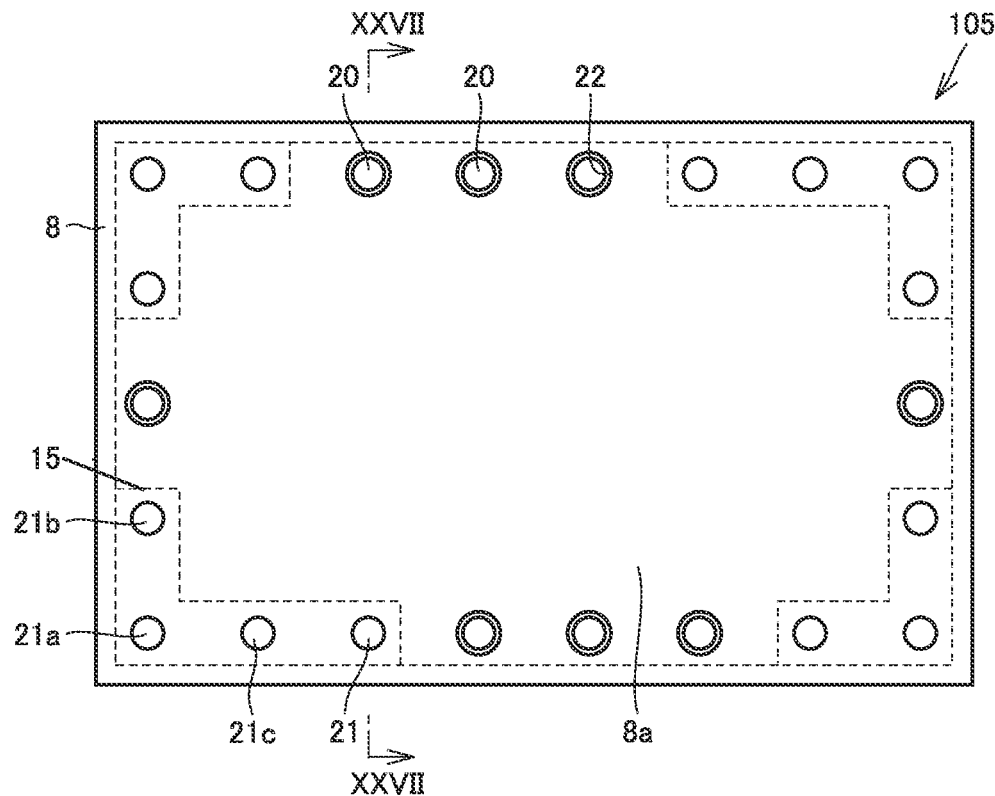
FIG. 26 is a bottom view of a module in a fifth embodiment based on the present disclosure.
Figure 27:
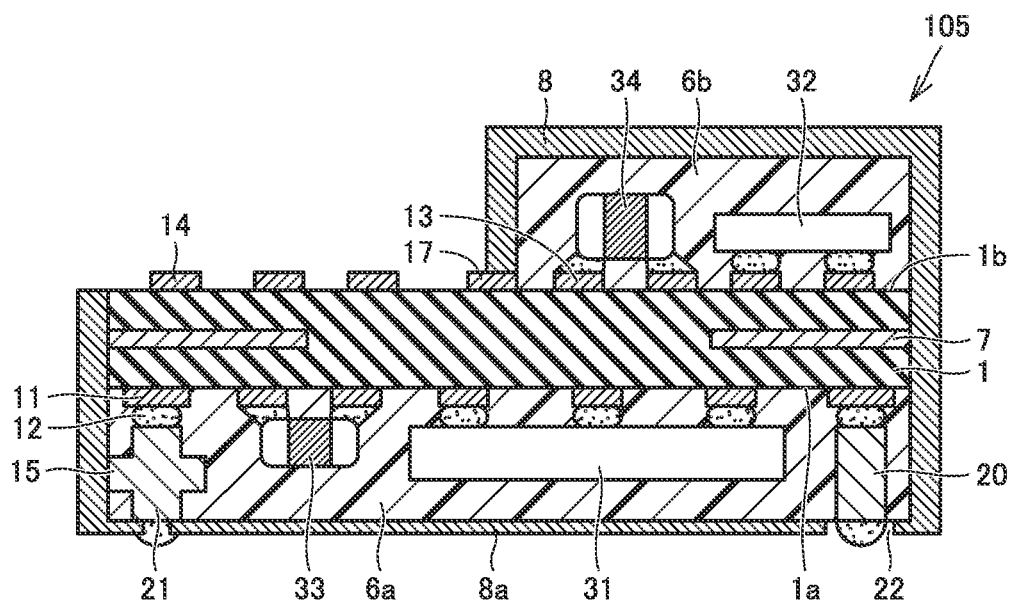
FIG. 27 is a cross-sectional view along a line XXVII-XXVII in FIG. 26 as seen in the direction of arrows.

Referring to FIGS. 26 to 27, a module in a fifth embodiment based on the present disclosure is described. FIG. 26 shows a bottom view of a module 105 in the present embodiment. FIG. 27 shows a cross-sectional view along a line XXVII-XXVII in FIG. 26 as seen in the direction of arrows. Module 105 has a basic configuration similar to that of module 104 described in the fourth embodiment. Unlike in module 104, shield film 8 includes backside shield film 8a in module 105. The surface of first sealing resin 6a facing away from substrate 1 is covered with backside shield film 8a. Backside shield film 8a is part of shield film 8. The details of backside shield film 8a are similar to those described in the third embodiment.

The advantageous effect described in the fifth embodiment can be obtained in module 105 in the present embodiment. Furthermore, module 105 includes backside shield film 8a as part of shield film 8, and can therefore achieve enhanced shielding performance on first component 31 and the like mounted on first surface 1a of substrate 1.

In forming shield film 8 by sputtering in order to manufacture module 105 in the present embodiment, shield film 8 on the upper surface and shield film 8 on the lower surface may be formed in separate steps. By performing at least two sputtering steps, a module having shield film 8 on both the upper surface and the lower surface can be obtained.

More than one of the above-described embodiments may be employed in an appropriate combination.

It should be understood that the embodiments disclosed herein are illustrative and non-restrictive in every respect. The scope of the present disclosure is defined by the terms of the claims and is intended to include any modifications within the scope and meaning equivalent to the terms of the claims.

1 substrate; 1a first surface; 1b second surface; 6a first sealing resin; 6b second sealing resin; 7, 17 ground electrode; 8 shield film; 8a backside shield film; 11 electrode; 12 solder; 13 electrode; 14 antenna; 15 protruding portion; 16 plate portion; 20 signal terminal; 21 ground terminal; 21a first ground terminal; 21b second ground terminal; 21c third ground terminal; 22 opening; 25 mass (including ground terminals); 26 structure (including signal terminals); 31 first component; 32 second component; 40 plate member; 41 protrusion; 42 flat portion; 43 joint portion; 101, 102, 103, 104, 105 module.

The invention claimed is:

1. A module comprising:
   a substrate having a first surface;
   a first component mounted on the first surface;
   a first sealing resin disposed to cover the first surface and the first component;
   a shield film covering at least a side surface of the first sealing resin;
   a first ground terminal mounted on the first surface; and
   a protruding portion provided to extend laterally at a middle of the first ground terminal in a direction parallel to the first surface, wherein
   the protruding portion is connected to a portion of the shield film covering the side surface of the first sealing resin.

2. The module according to claim 1, comprising a second ground terminal mounted on the first surface, wherein
   the protruding portion couples the first ground terminal and the second ground terminal to each other, and is further provided to extend outward from the first ground terminal and the second ground terminal.

3. The module according to claim 2, comprising a third ground terminal mounted on the first surface, wherein
   the protruding portion couples the first ground terminal and the third ground terminal to each other, and is further provided to extend outward from the first ground terminal, the second ground terminal and the third ground terminal, and
   when viewed in a direction perpendicular to the first surface, the second ground terminal, the first ground terminal and the third ground terminal are arranged in an L-shape in this order.

4. The module according to claim 3, wherein
   the first ground terminal is located in a corner portion of the first surface.

5. The module according to claim 3, wherein
   the protruding portion is located in a middle of the first ground terminal in the direction perpendicular to the first surface.

6. The module according to claim 3, wherein
   the substrate has a second surface as a surface opposite to the first surface, and
   the module further comprises a second component mounted on the second surface.

7. The module according to claim 3, wherein
   the substrate has a second surface as a surface opposite to the first surface, and
   an antenna is disposed on the second surface.

8. The module according to claim 2, wherein
   the first ground terminal is located in a corner portion of the first surface.

9. The module according to claim 2, wherein
   the protruding portion is located in a middle of the first ground terminal in a direction perpendicular to the first surface.

10. The module according to claim 2, wherein
    the substrate has a second surface as a surface opposite to the first surface, and
    the module further comprises a second component mounted on the second surface.

11. The module according to claim 2, wherein
    the substrate has a second surface as a surface opposite to the first surface, and
    an antenna is disposed on the second surface.

12. The module according to claim 1, wherein
    the first ground terminal is located in a corner portion of the first surface.

13. The module according to claim 12, wherein
    the shield film covers a surface of the first sealing resin located farther from the substrate, and the shield film further has an opening in the surface of the first sealing resin located farther from the substrate,
    the module further comprises a signal terminal mounted on the first surface, and
    the signal terminal is exposed at the opening without being electrically connected to the shield film.

14. The module according to claim 13, wherein
    the first ground terminal is electrically connected to a portion of the shield film covering the surface of the first sealing resin located farther from the substrate.

15. The module according to claim 12, wherein
    the protruding portion is located in a middle of the first ground terminal in a direction perpendicular to the first surface.

16. The module according to claim 12, wherein
    the substrate has a second surface as a surface opposite to the first surface, and
    the module further comprises a second component mounted on the second surface.

17. The module according to claim 1, wherein
    the protruding portion is located in a middle of the first ground terminal in a direction perpendicular to the first surface.

18. The module according to claim 17, wherein
    the substrate has a second surface as a surface opposite to the first surface, and
    the module further comprises a second component mounted on the second surface.

19. The module according to claim 1, wherein
    the substrate has a second surface as a surface opposite to the first surface, and
    the module further comprises a second component mounted on the second surface.

20. The module according to claim 1, wherein
    the substrate has a second surface as a surface opposite to the first surface, and
    an antenna is disposed on the second surface.

* * * * *